United States Patent
Mercs et al.

(10) Patent No.: US 6,807,278 B1
(45) Date of Patent: Oct. 19, 2004

(54) AUDIO NOISE REDUCTION SYSTEM IMPLEMENTED THROUGH DIGITAL SIGNAL PROCESSING

(75) Inventors: Laura Mercs, Hungtington Beach, CA (US); Paul M. Embree, Irvine, CA (US)

(73) Assignees: Sony Corporation of Japan, Tokyo (JP); Sony Pictures Entertainment, Inc., Park Ridge, NJ (US)

( * ) Notice: Subject to any disclaimer, the term of this patent is extended or adjusted under 35 U.S.C. 154(b) by 0 days.

(21) Appl. No.: 09/158,674

(22) Filed: Sep. 22, 1998

Related U.S. Application Data

(63) Continuation of application No. 08/562,287, filed on Nov. 22, 1995.

(51) Int. Cl.[7] .............................................. H04B 15/00
(52) U.S. Cl. ...................................... 381/94.1; 381/56
(58) Field of Search ................................ 381/106, 104, 381/94.9, 94.1, 94.2, 94.3, 93, 56

(56) References Cited

U.S. PATENT DOCUMENTS

| | | | |
|---|---|---|---|
| 4,208,548 A | | 6/1980 | Orban |
| 4,701,722 A | * | 10/1987 | Dolby ........................ 381/106 |
| 4,736,433 A | | 4/1988 | Dolby |
| 4,802,222 A | | 1/1989 | Weaver |
| 5,150,370 A | | 9/1992 | Furuya et al. |
| 5,150,379 A | | 9/1992 | Baugh et al. |
| 5,168,526 A | | 12/1992 | Orban |
| 5,257,292 A | | 10/1993 | Sauvagerd et al. |
| 5,291,557 A | | 3/1994 | Davis et al. |
| 5,319,584 A | | 6/1994 | Ooyabu |
| 5,377,276 A | | 12/1994 | Terai et al. |
| 5,406,622 A | * | 4/1995 | Silverberg et al. ......... 381/94.1 |
| 5,483,600 A | | 1/1996 | Werrbach |
| 5,848,163 A | * | 12/1998 | Gopalakrishnan et al. .... 381/56 |

FOREIGN PATENT DOCUMENTS

| | | |
|---|---|---|
| EP | 0 141 424 | 11/1984 |
| EP | 0 308 826 | 9/1988 |
| EP | 0 525 809 A2 | 7/1992 |
| EP | 0 599 132 A2 | 11/1993 |
| GB | 2 181 626 A | 4/1987 |
| WO | WO 90/12453 | 10/1990 |

OTHER PUBLICATIONS

Audio and Electroacoustics, Underwater Signal Processing, New York, Apr. 11–14, 1988, vol. 5, No. 1988, Apr. 11, 1988, Institute of Electrical and Electronics Engineers, pp. 2594–2597, XP000041719 Eriksson L J et al.: Active Noise Control Using Adaptive Digital Signal Processing.

(List continued on next page.)

*Primary Examiner*—Minsun Oh Harvey
(74) *Attorney, Agent, or Firm*—Haverstock & Owens LLP

(57) ABSTRACT

A decoder capable of decoding audio signals encoded using analog noise reduction techniques, particularly Dolby A, is implemented by means of digital signal processing. The encoded signal passes through one or more digital filters, producing the decoded signal. The decoded signal is fed back to drive control blocks, which determine the parameters of the digital filters. The determination of these parameters may be arranged so as to emulate closely a given analog noise reduction decoder, such as a Dolby A decoder. The one or more digital filters are relocated to the feed-forward portion of the decoder—they are located in the feedback portion of the encoder when performed using analog techniques—to overcome the problems caused by delay introduced by the digital implementation which prevent a direct conversion of the analog decoder to a digital one.

2 Claims, 7 Drawing Sheets

OTHER PUBLICATIONS

Signal, Processing II: Theories and Applications, Proceedings of Eusipco 83, Erlangen, DE, vol. 3, Sep. 13, 1994, Edinburgh, UK, pp. 1472–1477, XP000617880 Atherton P: "Consumer Audio DSP Applications Using Motorola's DSP56004".

Gateway To The Future—Technology In Motion, St. Louis, May 19–22, 1991, no Conf. 41, May 19, 1991, Institute of Electrical and Electronics Engineers, pp. 263–268, XP000260189, Masahichi Kishi et al.: "A Proposal of Short Time DFT Syllabic Compander and Its Configurations".

Elektronik Praxis, vol. 28, No. 1, Jan. 7, 1993, pp. 44–47, XP000617854 "Klangfelder Audio–Effekte MIT Surround-Prozssoren".

Wissen Teil 3 und Schlub, p. 50–52, Geehard Hohmuth, Dolby–Kompander–Systeme in der Magnet–Tontechnik.

Ray M. Dolby Journal of The Audio Engineering Society, p. 383–388, An Audio Noise Reduction System.

* cited by examiner

AUDIO NOISE REDUCTION SYSTEM IMPLEMENTED THROUGH DIGITAL SIGNAL PROCESSING

This is a continuation of copending application Ser. No. 08/562,287, filed Nov. 22, 1995, the disclosure of which is hereby incorporated by reference.

FIELD OF THE INVENTION

This invention pertains to audio digital signal processing and to the use of digital signal processing (DSP) in audio noise reduction systems, and more particularly to the use of DSP techniques to decode audio signals that have been encoded using analog noise reduction techniques.

ART BACKGROUND

It is recognized today that there are many advantages to recording audio information, such as music and human voices, in a fully digital fashion, as is done for example on audio compact discs (CDs). One of the biggest advantages is the elimination of noise that is inherent to the recording, mastering and playback of audio signals employing well-known analog techniques. Clearly, once the audio has been accurately encoded into numbers, there can be no corruption of the content by externally coupled noise. Despite these obvious advantages, however, analog audio recording is still widely used in certain industries, such as the film industry, in part because of their large investment in existing analog equipment. For example, there is an enormous installed base of analog playback equipment that would be incompatible with digitally formatted audio material. Moreover, there is a vast collection of existing subject matter which has already been recorded in an analog format and which therefore requires analog playback equipment.

When an analog audio signal is copied, edited, recorded on magnetic tape, read back from magnetic tape, or otherwise transmitted, significant noise is typically introduced in a cumulative manner at each such processing step. As a result, various noise reduction systems have been invented to lessen the impact of the noise on the quality of a recording as perceived by listeners. A typical noise reduction system transforms the captured analog audio waveform into an audio waveform having altered characteristics, for example, by boosting the waveform's amplitude in certain portions of the frequency spectrum. This transformation is referred to as "encoding." The encoded analog waveform is recorded, for example, on magnetic tape or otherwise transmitted.

As part of the playback process, the encoded waveform is subjected to a second transformation referred to as "decoding." That transformation is designed to reverse the original encoding transformation and restore the original waveform as closely as possible to its original spectral character. The overall process will achieve noise reduction if the decoding transformation is one which tends to reduce the amplitude of the kinds of noise which are typically encountered, such as low-level broadband noise. Reversing an encoding process which gains up signals at certain frequencies before noise is introduced will reduce the amplitudes of those components to their original values, while reducing any noise signals injected subsequent to the encoding process and having components at those frequencies by the same factor. A widely used noise reduction system is Dolby A, described in Ray M. Dolby, "An Audio Noise Reduction System," 15 J. Audio Eng. Soc. 383 (1967), the entirety of which is incorporated herein by this reference.

Because the motion picture industry continues to record, mix and play back its audio subject matter using analog techniques, audio noise reduction systems implemented in the film industry have heretofore been implemented exclusively through analog signal processing techniques (i.e. using circuits made up of resistors, capacitors, operational amplifiers and other analog electronic components). A number of significant disadvantages inhere to the analog implementation of noise reduction processes. For example, problems arise as a consequence of manufacturing-lot and temperature variations in the values of the resistors and capacitors used to implement the analog circuits, in the offset voltages and other parameters of operational amplifiers, etc. Moreover, environmental conditions can also cause drifts in such parameters. In a noise reduction system, such variations could result in a mismatch between the circuit which encodes and the circuit which decodes, leading to discernable differences between the original input waveform and the decoded waveform. Such analog implementations are also inflexible, requiring changes in components or component values to achieve upgrades, redesigns or to customize characteristics.

Digital signal processing equipment has been steadily declining in cost and increasing in capability over the past decades. Many signal processing tasks which were formerly carried out through analog circuits are now performed primarily through digital signal processing. Digital signal processing offers the possibility of circuits having lower cost, smaller size, and lower power consumption, particularly when a number of signal processing functions can share one digital signal processor. Digital signal processing makes available to the designer filters with transfer characteristics which would be difficult to realize economically with analog signal processing circuitry. Digital signal processing also avoids many of the problems which exist in analog signal processing circuits. For example, the manufacturing-lot and temperature variations referred to above are not a problem in digital signal processing; because the coefficient values that define a filter in DSP are stored as digital quantities, they do not vary from one manufacturing lot to another, nor do they vary with temperature. Moreover, DSP systems are extremely flexible in that they can be refined, redesigned or adjusted by simply loading new software with which to configure the DSP processor.

While techniques have become known in the art for designing digital signal processing systems which merely implement digitally preexisting analog signal processing systems, certain noise reduction systems of the type exemplified by Dolby A cannot be implemented simply by straight-forward conversion into an analogous digital signal processing system. Indeed, the common wisdom in the industry is that the decoding of known analog noise reduction schemes such as Dolby A cannot be successfully implemented digitally. The reason for this is the strategy which Dolby A and similar systems employ for decoding.

FIGS. 1a and 1b depict a high-level representation of the structure employed by Dolby A and similar systems to encode and decode audio signals respectively. The signal X 105 to be encoded passes through an encoding block 110, the output of which is added to the original signal by an adder 115, producing the encoded audio signal Y 120. During playback, an audio signal $Y_N$ 145 (which is the encoded signal Y 120 which has had noise introduced to it through the various analog recording, mixing and playback processes as previously discussed) is decoded to produce an audio signal $X_n$ which represents the original audio signal X 105, with any noise introduced through recording, mixing, etc. having been reduced. The decoding process operates by employing an encoding block 130, the transfer function of which is identical to that of the encoding block 110 used to encode the original signal X 105. The reconstructed (i.e. decoded) signal $X_n$ 135 is fed back to encoding block 130 to produce an encoded version of the reconstructed signal which is then subtracted from the encoded signal $Y_N$ by adder 125 to produce the reconstructed signal.

In effect, the decoder assumes what the reconstructed output $X_n$ should be and then uses it to produce a signal from encoding block 130 which is, with respect to all components of the signal $X_n$ except the noise, exactly what is added to the original signal X 105 during the encoding process. By subtracting this signal from the encoded signal $Y_N$, the reconstructed signal $X_n$ is produced. The advantage of this scheme is that the two encoding blocks 110 and 130 can be identical, and if one ignores any noise which may have been introduced into the encoded signal 120 between encode and decode, then the decoded signal 135 is guaranteed to be identical to the encoded one.

This playback scheme essentially assumes that the decoded signal 135 is the original unencoded signal 105 and uses a sample of the decoded signal 135 at time $t_1$ to calculate that signal 130 which must be subtracted from the encoded signal 145 at time $t_1$ to produce the original output. Because the delay through the feedback loop is minimal using analog circuits, this system will not be unstable for frequencies over the audio range.

The structure of FIG. 1b is not suited for straightforward conversion to a digital signal processing implementation. A straightforward conversion of the decoder would replace the analog encoding block 130 with a digital signal processor having a closely similar transfer characteristic. While it is possible using techniques known in the art to program a digital signal processor to closely imitate the amplitude gain of analog encoding block 130 (see, for example, Alan V. Oppenheim & Ronald W. Schafer, *Discrete-Time Signal Processing* sec. 7.1 (1989)), any digital signal processing implementation of that encoding block would inevitably introduce a delay $t_D$ between the time $t_1$ that a sample of the decoded signal 145 is available and the time $t_1+t_D$ that the value 140 generated from that sample by the encoding block 130 becomes available. Because of this delay, it is impossible to generate the decoded signal 135 by subtracting from the current sample of the input signal 145 the value generated by encoding block 130 from that sample; rather, the only feasible way to generate decoded signal 135 is to subtract from the current sample of the input signal 145 the value generated by encoding block 130 from the previous sample of input signal 145. This introduces a delay of at least one sample period into the feedback loop of the decoder of FIG. 1b.

In audio processing, samples are generally taken at a rate of 44.1 kHz, i.e. approximately every 23 μs. As is well known, delays in feedback loops tend to make systems unstable. In the case at hand, it is found that the one-sample-period delay renders a straight conversion of the structure of FIG. 1b unstable for some frequencies over the audio range and therefore unusable. Thus, to produce the result of the decoding scheme of FIG. 1b digitally, a radically different approach must be invented to compensate for the digital delay. The scheme must be emulated rather than imitated.

In sum, a straightforward conversion of the analog circuitry is not possible, but because of the many cost and performance advantages that could be realized using DSP, there is a need in the art for a method of digitally decoding Dolby A-type and similar decoding systems; such an implementation must employ a different overall structure from that of existing analog decoders to emulate rather than imitate the analog process.

SUMMARY OF THE INVENTION

It is therefore an objective of the present invention to overcome the heretofore unresolved problem of achieving stable operation in spite of feedback loop delay in a DSP implementation of analog noise reduction systems of the same general type as Dolby A. It is a further objective of the invention to emulate closely the overall transfer function of the analog decoder of a Dolby A-type noise reduction system so that the audio signal recovered using the present invention is not discernably different than if it had been recovered by an analog Dolby A noise reduction decoder.

In order to achieve these objectives, the invention takes each sample of the encoded signal and passes it through a cascade of three biquadratic digital filters to generate a sample of the decoded signal. That sample is also passed through a control block, which generates the parameters of the three biquadratic filters which will be used to process the next sample of the encoded signal. Like the prior art analog Dolby A decoder, the invention has a feedback path through which the decoded signal passes. However, the feedback path in the invention does not generate a signal which is subtracted from the input signal as in the prior art analog Dolby A decoder; it only generates parameters for the three biquadratic filters. The signal to be subtracted from the input signal in the prior art analog Dolby A decoder is a rapidly-varying signal; it varies just as rapidly as the encoded input signal. In contrast, it turns out that the parameters for the biquadratic filters vary much more slowly than the encoded input signal. Because the feedback path of the invention generates only this slowly-varying signal, the delay $t_D$ in the feedback loop—which was fatal to the straightforward conversion of an analog Dolby A decoder to DSP—no longer has any deleterious effect.

The invention is preferably implemented using a digital signal processor programmed to realize the three biquadratic digital filters as well as all the processing in the feedback loop. In the feedback loop, the decoded signal first passes through an 80 Hz lowpass filter, a 3 kHz highpass filter, and a 9 kHz highpass filter, producing three bandlimited versions of the signal. A fourth bandlimited version of the signal is produced by subtracting the 80 Hz lowpass and 3 kHz highpass versions from the decoded signal, thus generating a version of the decoded signal limited to the band 80 Hz to 3 kHz. Each of the four bandlimited signals is passed through a digital fast-attack slow-decay rectifier, and the outputs of these rectifiers are used to look up gain quantities in a lookup table. The gain quantities programmed into the table are determined empirically by measuring the gain which the analog encoder whose output is to be decoded applies to signals of different frequencies and amplitudes. The gain quantities in turn are used to compute the coefficients of the transfer functions of the three biquadratic digital filters referred to above; the formulas for this computation, given below, were derived so as to make the overall transfer function of the three biquadratic digital filters match that of the analog decoder being emulated.

DETAILED DESCRIPTION OF THE INVENTION

Figure 1A:
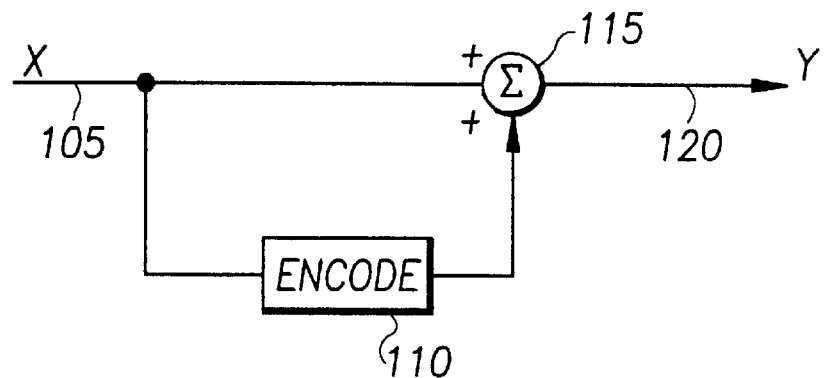
FIG. 1a (prior art) depicts the high-level structure of existing encoders for noise reduction systems like Dolby A.
Figure 1B:
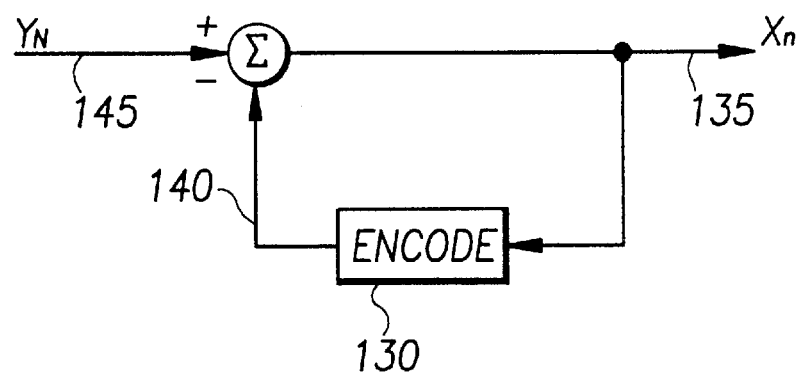
FIG. 1b (prior art) depicts the high-level structure of existing decoders for noise reduction systems like Dolby A.
Figure 2A:
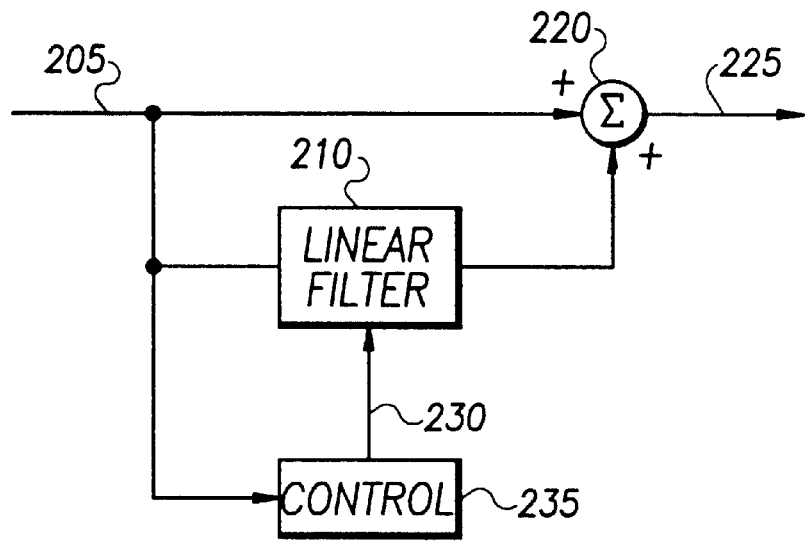
FIG. 2a (prior art) shows how an existing encoder of a noise reduction system like Dolby A may be viewed as containing a linear filter part and a control part.
Figure 2B:
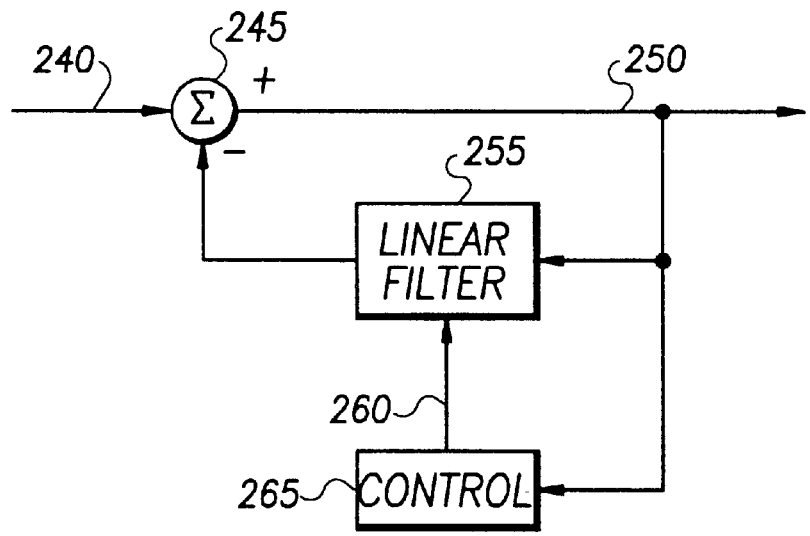
FIG. 2b (prior art) shows how an existing decoder of a noise reduction system like Dolby A may be viewed as containing a linear filter part and a control part.

A key insight embodied in the invention is that the encode and decode functions of existing noise reduction systems (for example, Dolby A) may be conceptualized as being divided into a linear filter part and a control part in the manner depicted in FIGS. 2a and 2b. In the encoder shown in FIG. 2a, the signal 205 to be encoded is an input to both a linear filter 210 and the control circuit 235. The linear filter 210 produces the encoding signal which is summed with the input signal in the adder 220. The control circuit 235 merely generates control signals 230 which alter the parameters of the linear filter 210. The control signals 230 typically are of much lower frequency than the signal 205 which is being encoded, since the control is designed to vary according to the average behavior of signal 205 over a certain period of time. The decoding shown in FIG. 2b, in accordance with the principle depicted in FIG. 1b, employs a linear filter 255 and a control 265 identical to those used to encode, and subtracts the output of the linear filter 255 from the signal 240 which is to be decoded in order to produce the decoded signal 250.

Figure 2C:
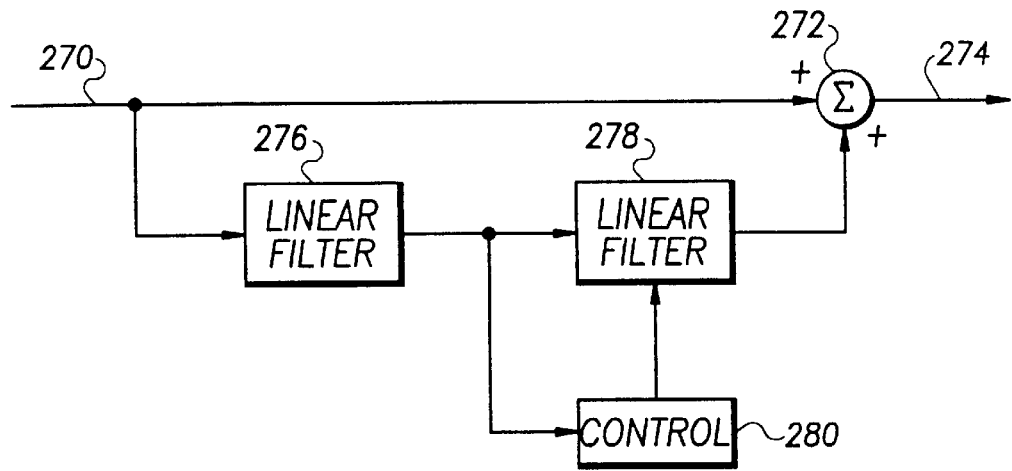
FIGS. 2c and 2d (prior art) depicts a slightly different way of viewing an existing encoder and decoder of a noise reduction system as containing a linear filter part and a control part.
Figure 2D:
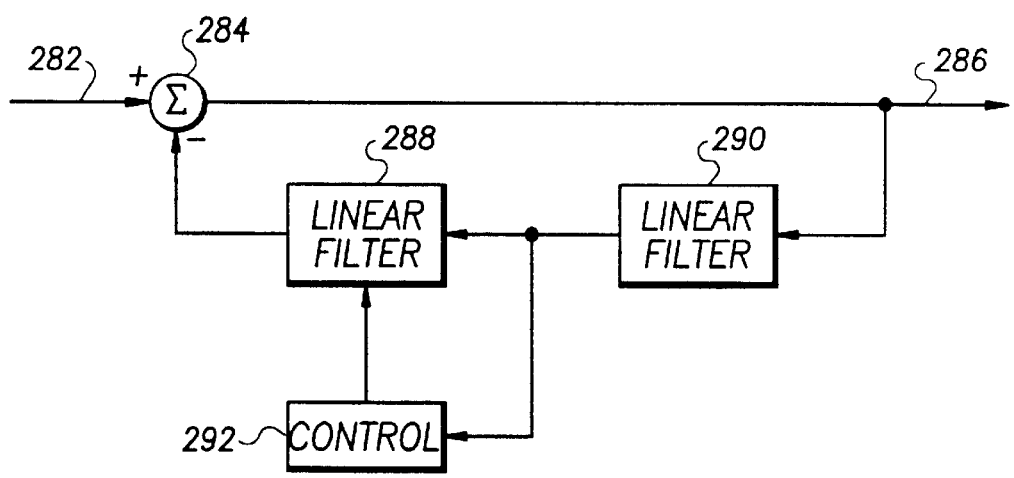

FIG. 2c depicts a slightly different form of the linear filter/control model for encoders and decoders. In the encoder, the signal 270 passes through a first linear filter 276. The output of that linear filter drives a second linear filter 278 and a control block 280. The control block, just as in the previous form, determines the parameters of linear filter 278, whose output is added to the input signal 270 to produce the encoded output signal 274. The decoder also employs two linear filters 288 and 290 and a control block 292 which determines the parameters of linear filter 288. The output of linear filter 288 is subtracted from the input signal 282 to produce the decoded output signal 286.

Figure 3:
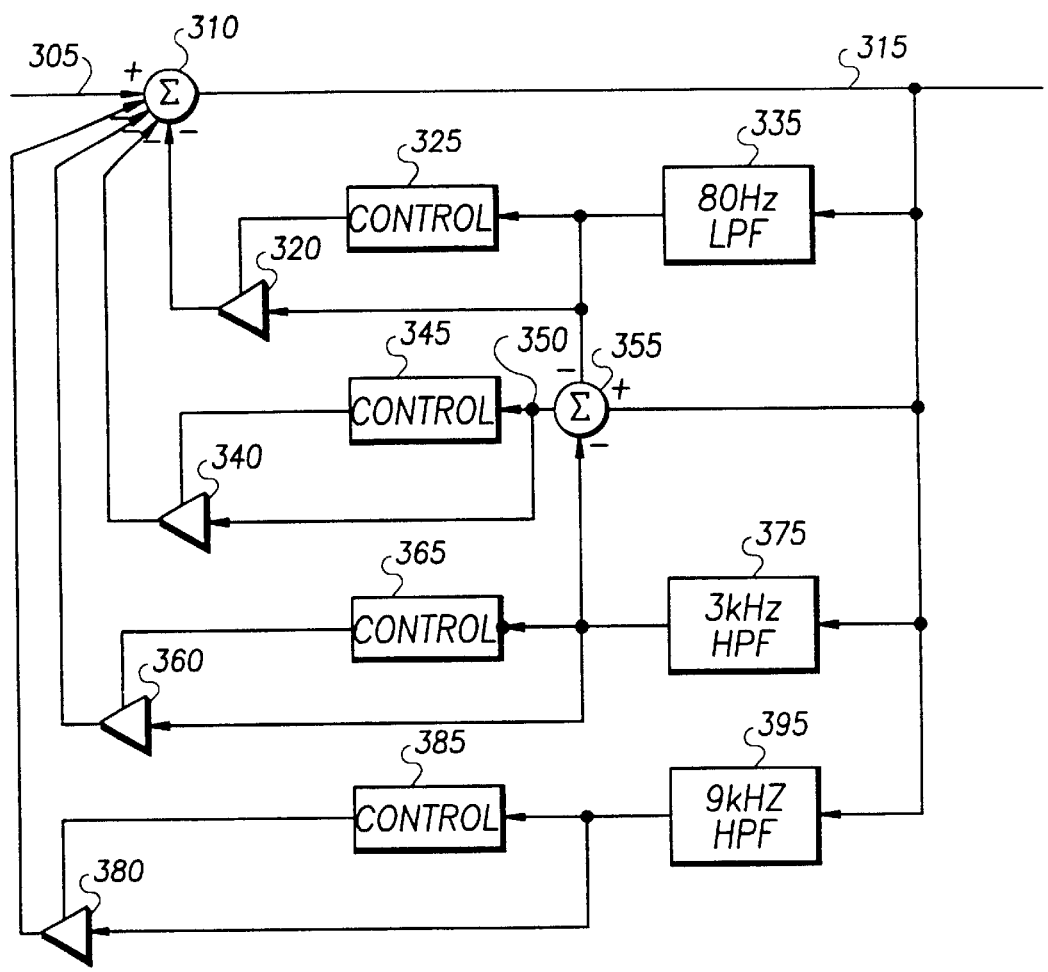
FIG. 3 (prior art) illustrates a more detailed block-level schematic of a Dolby A noise reduction system implementation, viewed as containing a linear filter part and a control part.

FIG. 3 shows how an analog Dolby A noise reduction system implementation can be conceptualized as having a linear filter part and a control part. The output signal 315 is fed through three linear filters 335 (80 Hz lowpass), 375 (3 kHz highpass), 395 (9 kHz highpass). Furthermore, the outputs of the 80 Hz lowpass filter 335 and 3 kHz highpass filter 375 are subtracted out from the output signal 315 in adder 355, giving a signal 352 in the frequency range 80 Hz to 3 kHz. This signal, and the bandlimited signals produced by the three filters 335, 375, 395, are input both to control blocks 325, 345, 365, 385 and to amplifiers 320, 340, 360, 380, whose gains are determined by the outputs of the control blocks. The amplifier outputs are what is subtracted from the input signal 305 in adder 310 to get the output signal 315. It is thus seen that Dolby A noise reduction fits into the linear filter/control paradigm depicted in FIG. 2. In Dolby A, the linear filter parameters which the control generates are the overall gain in the four frequency bands (a) below 80 Hz, (b) between 80 Hz and 3 kHz, (c) above 3 kHz, and (d) above 9 kHz.

Figure 4:
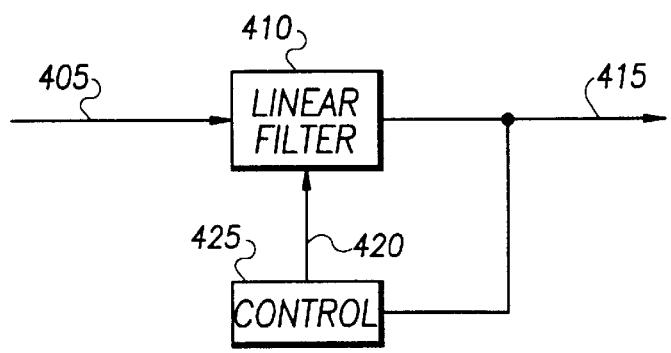
FIG. 4 depicts the high-level structure of the preferred embodiment of the invention.

FIG. 4 depicts a high-level block diagram of the structure of the preferred embodiment of the decoder of the present invention. As is seen in the figure, the present invention fundamentally alters the basic decoder structure of the prior art, moving the linear filter portion of the decoder of FIG. 2b out of the feedback path and into the direct signal path. The signal 405 which is to be decoded thus goes directly into a linear digital filter 410 which produces the output signal 415. This signal is then fed back into digital control logic 425, which determines certain parameters of the linear digital filter 410. This arrangement works because the control signal does not vary as rapidly as the signal, and thus the inevitable delay of at least one sample period, which the control signal suffers in the feedback path, does not render the overall system unstable. However, in the arrangement of FIG. 4, the effect of the control signals 420 on the parameters of linear filter 410 cannot be the same as it was in encoding the signal using the analog Dolby A process. Put another way, the control logic 410 cannot be the same as the control logic of the Dolby A encoder and decoder because of the change in the basic structure of the decoder of the present invention in order to overcome the destabilizing effect of delay. Instead, as explained below, it is necessary to design the control logic 425 to generate control signals 420 which set the filter parameters to values such that the digital signal processing decoder produces an overall effect similar to that of the analog decoder which it is emulating.

Figure 5:
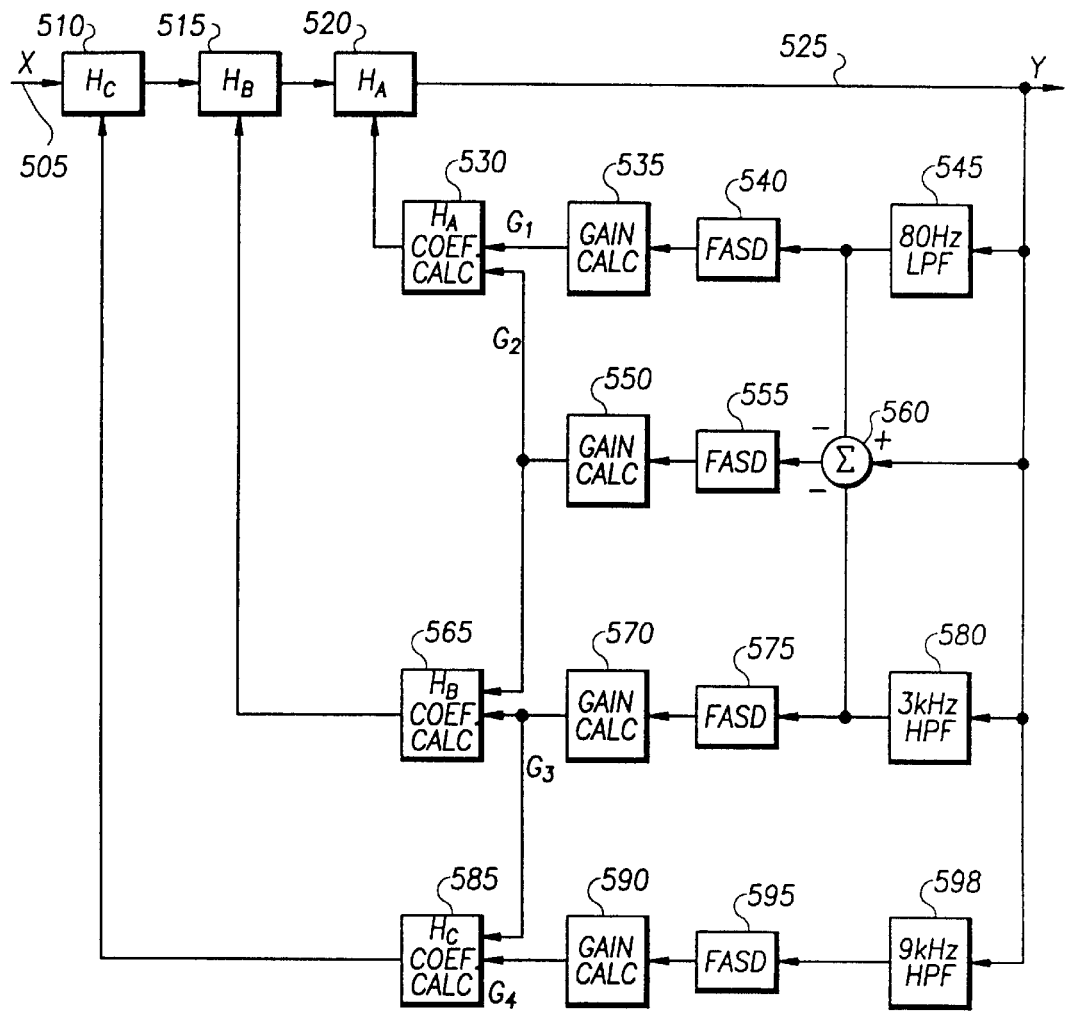
FIG. 5 depicts in greater detail a block-level diagram of the structure of the preferred embodiment of the invention.

FIG. 5 depicts in greater detail the structure of the preferred embodiment of the invention. As may be seen, a portion of this embodiment is patterned on FIG. 3 in order to make it easier to emulate precisely the effect of the analog decoder of FIG. 3. Thus, the output signal 525 passes, just as it does in FIG. 3, through an 80 Hz lowpass filter 545, a 3 kHz highpass filter 580, and a 9 kHz highpass filter 598. In the preferred embodiment of the invention these are second order Butterworth filters. There is an adder 560, analogous to the adder 355, which produces a version of the output signal limited to the band 80 Hz to 3 kHz. Just as in FIG. 3, the four bandlimited signals are input to four control circuits, here composed of fast-attack slow-decay (FASD) rectifiers 540, 555, 575, and 595, feeding into gain calculation blocks 535, 550, 570, 590.

There are also important differences between the analog decoder of FIG. 3 and the preferred embodiment of the invention, differences which were necessary in order to overcome the deleterious effects of delay on the decoder's stability and to implement the fundamentally altered general structure depicted in FIG. 4. Instead of the adder 310 and the amplifiers 320, 340, 360, 380 of FIG. 3, there is a cascade of three linear filters 510, 515, 520. Whereas the controls in FIG. 3 set the gains of the amplifiers 320, 340, 360, 380, here the gains computed by the gain calculation blocks 535, 550, 570, 590 are in turn input to further calculation blocks 530, 565, 585 which generate the transfer function coefficients of the three linear filters 510, 515, 520.

In the preferred embodiment, a single digital signal processor, an Analog Devices ADSP-21062, is programmed to implement all the signal processing depicted in FIG. 5. For more information on the ADSP-21062, one may refer to the ADSP-2106x user's manual and ADSP-21060/62 data sheet. The ADSP-21062 implements the signal processing functions depicted in FIG. 5 by performing the following processing steps on each output sample.

(1) Apply the 80 Hz, 3 kHz, and 9 kHz digital filters to the output sample, producing $x_0$, $x_2$, and $x_3$.

(2) Subtract the outputs of the 80 Hz and 3 kHz digital filters from the output sample to produce an 80 Hz-3 kHz bandpass filtered value, $x_1$.

(3) For i=0 through 3, apply a fast-attack slow-decay rectifier to $x_i$, producing a filtered value $y_i$, by means of the following substeps:
  (a) Read from storage $yold_i$, the value of $y_i$ computed for the previous output sample,
  (b) Compute $$y_i = f*yold_i + (1-f)*|x_i|,$$

where f is a filter coefficient which depends on i and on whether $|x_i| > yold_i$ (meaning that the rectifier is in the attack phase) or $|x_i| \leq yold_i$ (meaning that the rectifier is in the decay phase).

(4) For i=0 through 3, determine a gain coefficient $G_i$ by consulting a lookup table, using $y_i$ as an index:
  (a) Scale and clip $y_i$ to match the units and range of the lookup table;
  (b) Round the scaled and clipped value of $y_i$ to an integer j;
  (c) Use j as the index to a lookup table to determine $G_i$.

(5) Compute the coefficients of the transfer functions $H_A(z)$, $H_B(z)$, $H_C(z)$ of the filters 510, 515, 520 according to the following formulas:

$$H_A(z) = \frac{K_{1p} \cdot (1 + a_{11}z^{-1} + a_{12}z^{-2})}{1 + K_{1p}(a_{11}(1+G_2) + 2K_1(G_1 - G_2))z^{-1} + K_{1p}(a_{12}(1+G_2) + K_1(G_1-G_2))z^{-2}}$$

$$H_B(z) = \frac{(1+G_2) \cdot K_{2p} \cdot (1 + a_{21}z^{-1} + a_{22}z^{-2})}{1 + K_{2p}(a_{21}(1+G_2) - 2K_2(G_3-G_2))z^{-1} + K_{2p}(a_{22}(1+G_2) + K_2(G_3-G_2))z^{-2}}$$

$$H_C(z) = \frac{K_{3p} \cdot (1 + a_{31}z^{-1} + a_{32}z^{-2})}{1 + K_{3p}(a_{31} - 2K_3G_{3p})z^{-1} + K_{3p}(a_{32} + K_3G_{3p})z^{-2}}$$

where:
  $a_{11}$, $a_{12}$, $K_1$ are the coefficients of the 80 Hz lowpass filter, so that its transfer function $H_{80}(z)$ is $K_1(1+z^{-1})^2/(1+a_{11}z^{-1}+a_{12}z^{-2})$,
  $a_{21}$, $a_{22}$, $K_2$ are the coefficients of the 3 kHz highpass filter, so that its transfer function $H_{3k}(z)$ is $K_2(1-z^{-1})^2/(1+a_{21}z^{-1}+a_{22}z^{-2})$,
  $a_{31}$, $a_{32}$, $K_3$ are the coefficients of the 9 kHz highpass filter, so that its transfer function $H_{9k}(z)$ is $K_3(1-z^{-1})^2/(1+a_{31}z^{-1}+a_{32}z^{-2})$,
  $K_{1P}=1/(1+G_2+K_1(G_1-G_2))$,
  $K_{2P}=1/(1+G_2+K_2(G_3-G_2))$,
  $G_{3P}=G_4/(1+G_3)$,
  $K_{3P}=1/(1+G_{3P}K_3)$.

It is seen from these formulas that the filters 510, 515, 520 are biquadratic filters because their transfer functions H(z) are quotients X(z)/Y(z), where X(z) and Y(z) are quadratic polynomials.

(6) Apply the three filters 510, 515, 520 to a new input sample, generating a new output sample.

In the preferred embodiment of the invention, the filter coefficients used in step (3) above are as follows:

|  | Attack | Decay |
| --- | --- | --- |
| i = 0, 1 | 0.9898478 | 0.99962214 |
| i = 2, 3 | 0.97979867 | 0.99921838 |

Figure 6:
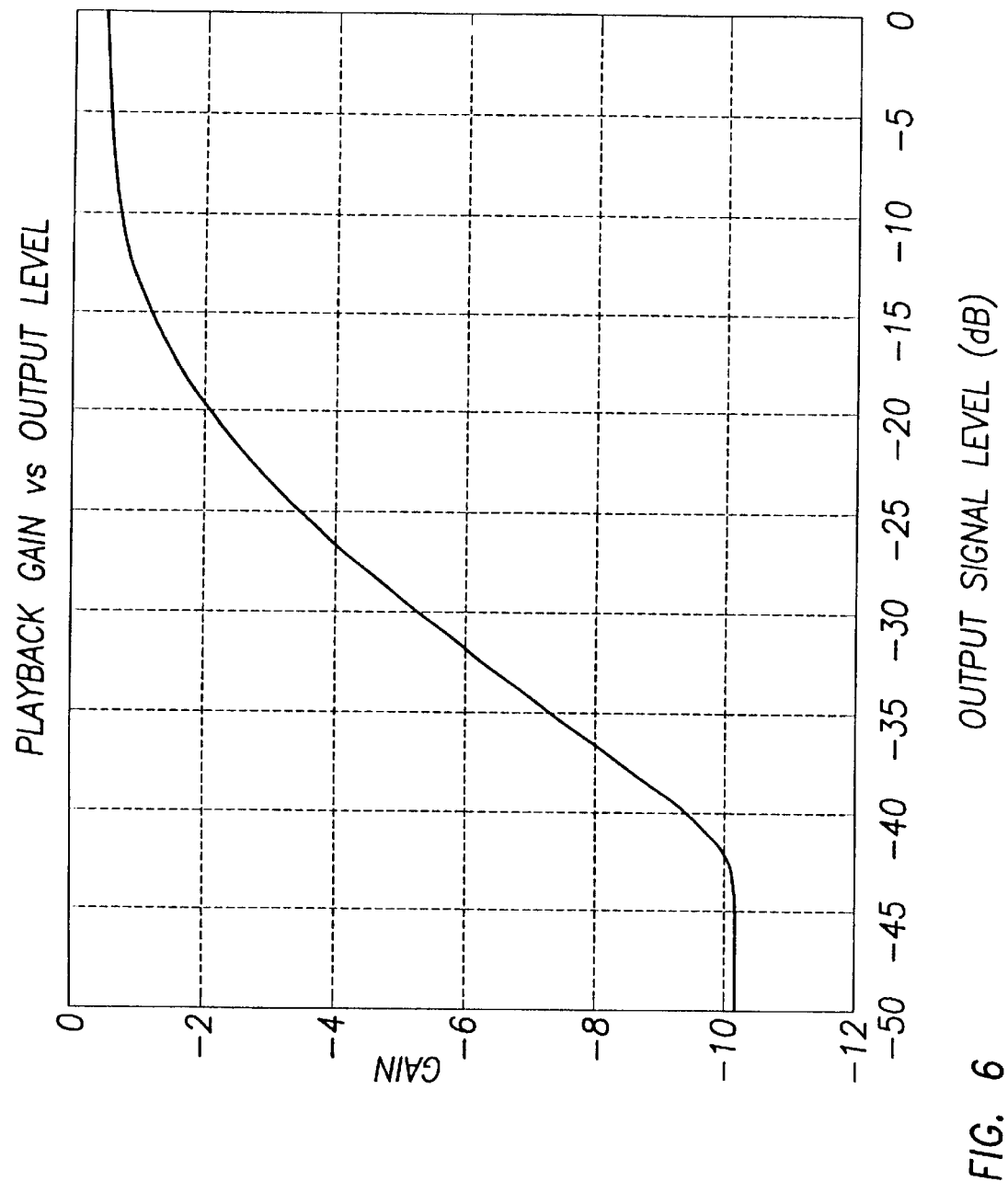
FIG. 6 is a graph of the gain values stored in the lookup table used by the preferred embodiment of the invention.

The lookup table used in step (4) above to compute the gains $G_i$ is determined empirically by using an analog encoder which implements the noise reduction system whose output one seeks to decode, for example, an analog Dolby A encoder. One drives the analog encoder with signals of known amplitude, with frequencies falling into each of the four frequency ranges used in the decoder (below 80 Hz, between 80 Hz and 3 kHz, above 3 kHz, and above 9 kHz). The output of the analog encoder is then input to the digital decoder. The appropriate table entry in the digital decoder is then adjusted until the output signal of the digital decoder is of the same amplitude as the input signal to the analog encoder. FIG. 6 is a graph of the gain values stored in the lookup table used in step 4(c) above. In that figure, 0 dB is the appropriate audio reference level for the kind of equipment with which one seeks to interoperate (4 dBu for professional equipment, -10 dBu for consumer equipment).

Figure 7:
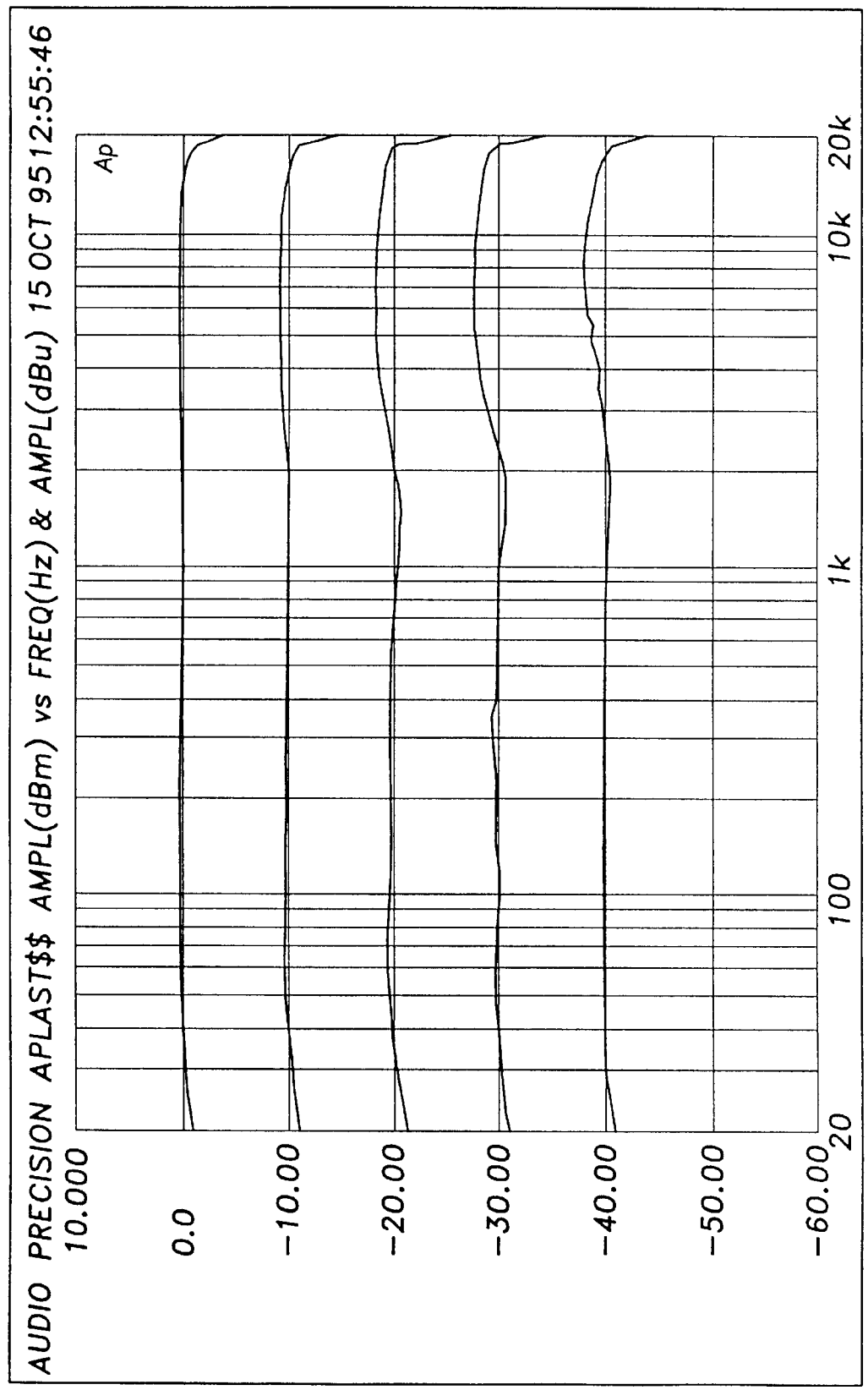
FIG. 7 is a graph of the difference between the input waveform and the output waveform when an input waveform is passed through an analog Dolby A encoder and the output of the encoder is then passed through the DSP decoder of the invention.

With proper selection of the lookup table values $G_i$ and other parameters, the decoder of the invention is capable of emulating the transfer characteristics of an analog Dolby A decoder quite closely. If one drives the prior art analog Dolby A decoder and the DSP decoder of the invention with the same test waveforms, differences of no more than 2 dB in the outputs, generally occurring at the highest frequencies, are observed. FIG. 7 is a graph of the difference between the input waveform and the output waveform when an input waveform is passed through an analog Dolby A encoder and the output of the encoder is then passed through the DSP decoder of the invention. An even closer correspondence between the output waveform would be achievable by changing the design of the DSP decoder to use a separate lookup table for the frequency range above 9 kHz.

The preferred embodiment described above is specifically designed to decode material encoded by an analog Dolby A noise reduction system. Although the preferred embodiment has some flexibility to handle other noise reduction systems by virtue of its programmable parameters, it may be preferable when decoding material encoded by means of other noise reduction systems to modify the structure shown in FIG. 5, for example, to use different frequencies for the lowpass and highpass filters, to have a different number of filters, to use other types of filters, or to modify the structure in other ways. Such modifications would often require only a change in the programming of the digital signal processor and not a change in the hardware.

A Matlab functional description of the control portion of the decoder of the present invention is attached as Appendix A.

Although the noise reduction system of this invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In an audio-frequency electronic noise reduction system, a decoder implemented by means of digital signal processing, said decoder receiving as input an encoded signal encoded in accordance with a signal compression noise reduction scheme and producing as output a decoded signal, said decoder comprising:

- a direct feed-forward signal path having a filter block having at least one digital linear filter, each said linear filter having a transfer function having a plurality of parameters; said filter block being driven by said encoded signal and producing as an output said decoded signal; and
- at least one feedback signal path having a control block for receiving said decoded signal and determining by means of digital signal processing said parameters of at least one of said linear filters as a function of said decoded signal;
- wherein said decoded signal approximates the signal which an analog Dolby A noise reduction system decoder would produce as output if it received said encoded signal as input.

2. For an audio-frequency electrical signal which has been encoded in accordance with a signal compression noise reduction scheme, a method of digitally decoding said encoded audio-frequency electrical signal so as to generate a decoded signal comprising the steps, executed repeatedly, of:

- in a direct feed-forward signal path, applying to a sample of said encoded signal a filter block having at least one digital linear filter, each said linear filter having a transfer function having a plurality of parameters, thereby generating a sample of said decoded signal; and
- in a feedback signal path, redetermining one or more of said parameters of at least one of said linear filters by means of digital signal processing as a function of said sample of said decoded signal;
- wherein said encoded audio-frequency electrical signal is a signal encoded in accordance with a Dolby A type noise reduction scheme.

* * * * *